(12) United States Patent
Park et al.

(10) Patent No.: US 11,244,905 B2
(45) Date of Patent: Feb. 8, 2022

(54) SUBSTRATE WITH ELECTRONIC COMPONENT EMBEDDED THEREIN

(71) Applicant: SAMSUNG ELECTRO-MECHANICS CO., LTD., Suwon-si (KR)

(72) Inventors: Je Sang Park, Suwon-si (KR); Chang Yul Oh, Suwon-si (KR); Sang Ho Jeong, Suwon-si (KR); Yong Duk Lee, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 121 days.

(21) Appl. No.: 16/795,985

(22) Filed: Feb. 20, 2020

(65) Prior Publication Data

US 2021/0183783 A1 Jun. 17, 2021

(30) Foreign Application Priority Data

Dec. 11, 2019 (KR) .................. 10-2019-0164454

(51) Int. Cl.
*H01L 23/538* (2006.01)
*H01L 23/498* (2006.01)
*H01L 23/31* (2006.01)

(52) U.S. Cl.
CPC ...... *H01L 23/5389* (2013.01); *H01L 23/5383* (2013.01); *H01L 23/5384* (2013.01);
(Continued)

(58) Field of Classification Search
CPC ......... H01L 23/49816; H01L 23/49827; H01L 23/3128; H01L 23/5389; H01L 23/5383; H01L 23/5384; H01L 23/49822
See application file for complete search history.

(56) References Cited

U.S. PATENT DOCUMENTS

2005/0211465 A1* 9/2005 Sunohara ............ H01L 25/0657
174/260
2006/0003495 A1* 1/2006 Sunohara ................ H01L 24/82
438/124

(Continued)

FOREIGN PATENT DOCUMENTS

JP 2016-149411 A 8/2016
JP 2017-162849 A 9/2017
KR 10-1901713 B1 9/2018

*Primary Examiner* — Julio J Maldonado
*Assistant Examiner* — John M Parker
(74) *Attorney, Agent, or Firm* — Morgan, Lewis & Bockius LLP

(57) ABSTRACT

A substrate with an electronic component embedded therein includes a core substrate including an insulating body having a first surface and a second surface, opposite to the first surface, a first wiring layer embedded in the insulating body such that one surface thereof is exposed from the first surface, and a second wiring layer disposed on the insulating body to protrude on the second surface, the core substrate having a cavity penetrating a portion of the insulating body from the first surface toward the second surface and having a stopper layer as a bottom surface thereof; an electronic component disposed on the stopper layer in the cavity; a first insulating material covering at least a portion of each of the core substrate and the electronic component; and a third wiring layer disposed on the first insulating material.

20 Claims, 8 Drawing Sheets

(52) U.S. Cl.
CPC .... *H01L 23/3128* (2013.01); *H01L 23/49816* (2013.01); *H01L 23/49827* (2013.01)

(56) References Cited

U.S. PATENT DOCUMENTS

| | | | |
|---|---|---|---|
| 2009/0237900 A1* | 9/2009 | Origuchi | H01L 24/82 361/763 |
| 2011/0215464 A1* | 9/2011 | Guzek | H01L 21/56 257/737 |
| 2012/0133052 A1* | 5/2012 | Kikuchi | H01L 24/24 257/774 |
| 2012/0153493 A1* | 6/2012 | Lee | H01L 24/24 257/774 |
| 2013/0249075 A1* | 9/2013 | Tateiwa | H01L 24/24 257/734 |
| 2014/0070396 A1* | 3/2014 | Kyozuka | H01L 24/24 257/698 |
| 2014/0182895 A1* | 7/2014 | Lee | H01L 24/18 174/251 |
| 2016/0233167 A1 | 8/2016 | Shimizu | |
| 2016/0338202 A1* | 11/2016 | Park | H01L 24/00 |
| 2017/0256478 A1 | 9/2017 | Sakamoto et al. | |
| 2017/0256578 A1 | 9/2017 | Hori | |
| 2018/0025997 A1* | 1/2018 | Lai | H01L 21/566 257/503 |
| 2019/0131253 A1 | 5/2019 | Lee et al. | |

\* cited by examiner

US 11,244,905 B2

SUBSTRATE WITH ELECTRONIC COMPONENT EMBEDDED THEREIN

CROSS-REFERENCE TO RELATED APPLICATION(S)

This application claims benefit of priority to Korean Patent Application No. 10-2019-0164454 filed on Dec. 11, 2019 in the Korean Intellectual Property Office, the disclosure of which is incorporated herein by reference in its entirety.

BACKGROUND

The present disclosure relates to a substrate having an electronic component embedded therein.

With an arrival of the $5^{th}$ generation (5G) era, the number of components that should be mounted on a mainboard of a smartphone has increased. In addition, it may also be necessary to secure a space in which components such as an antenna for 5G communications, a baseband modem, and the like, are mounted, while maintaining compatibility with 4G LTE communications. Accordingly, in addition to miniaturization of each component, miniaturization is being considered by modularizing existing components in a form of a system-in-package (SiP).

SUMMARY

An aspect to the present disclosure is to provide a substrate with an electronic component embedded therein capable of reducing warpage even in an asymmetrical structure.

Another aspect to the present disclosure is to provide a substrate with an electronic component embedded therein capable of modularization and miniaturization in a SiP form.

According to an aspect of the present disclosure, substrate with an electronic component embedded therein using a coreless substrate having a vertically inverted form as a core substrate is implemented.

According to another aspect of the present disclosure, a modularization structure is introduced by mounting a component on a substrate with an electronic component embedded therein.

For example, a substrate with an electronic component embedded therein according to an aspect of the present disclosure may include: a core substrate including an insulating body having a first surface and a second surface, opposite to the first surface, a first wiring layer embedded in the insulating body such that one surface thereof is exposed from the first surface, and a second wiring layer disposed on the insulating body to protrude on the second surface, the core substrate having a cavity penetrating a portion of the insulating body from the first surface toward the second surface and having a stopper layer as a bottom surface thereof; an electronic component disposed on the stopper layer in the cavity; a first insulating material covering at least a portion of each of the core substrate and the electronic component; and a third wiring layer disposed on the first insulating material.

For example, a substrate according to an aspect of the present disclosure may include: a first insulating layer; a first wiring layer embedded in the first insulating layer and exposed from an upper surface of the first insulating layer; a second insulating layer having a thickness less than that of the first insulating layer, and disposed on a lower surface of the first insulating layer; a second wiring layer embedded in the second insulating layer and being in contact with the first insulating layer; a stopper layer including a first portion in contact with the first and second insulating layers, and a second portion extending from the first portion and exposed by a cavity in the first insulating layer; an electronic component disposed on the stopper layer in the cavity; an insulating material covering a portion of each of the first insulating layer and the electronic component; and a first connection via disposed in the first insulating layer and connecting the first and second wiring layers to each other. A width of a cross-section of the first connection via may be tapered in a direction from the second insulating layer to the first insulating layer.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
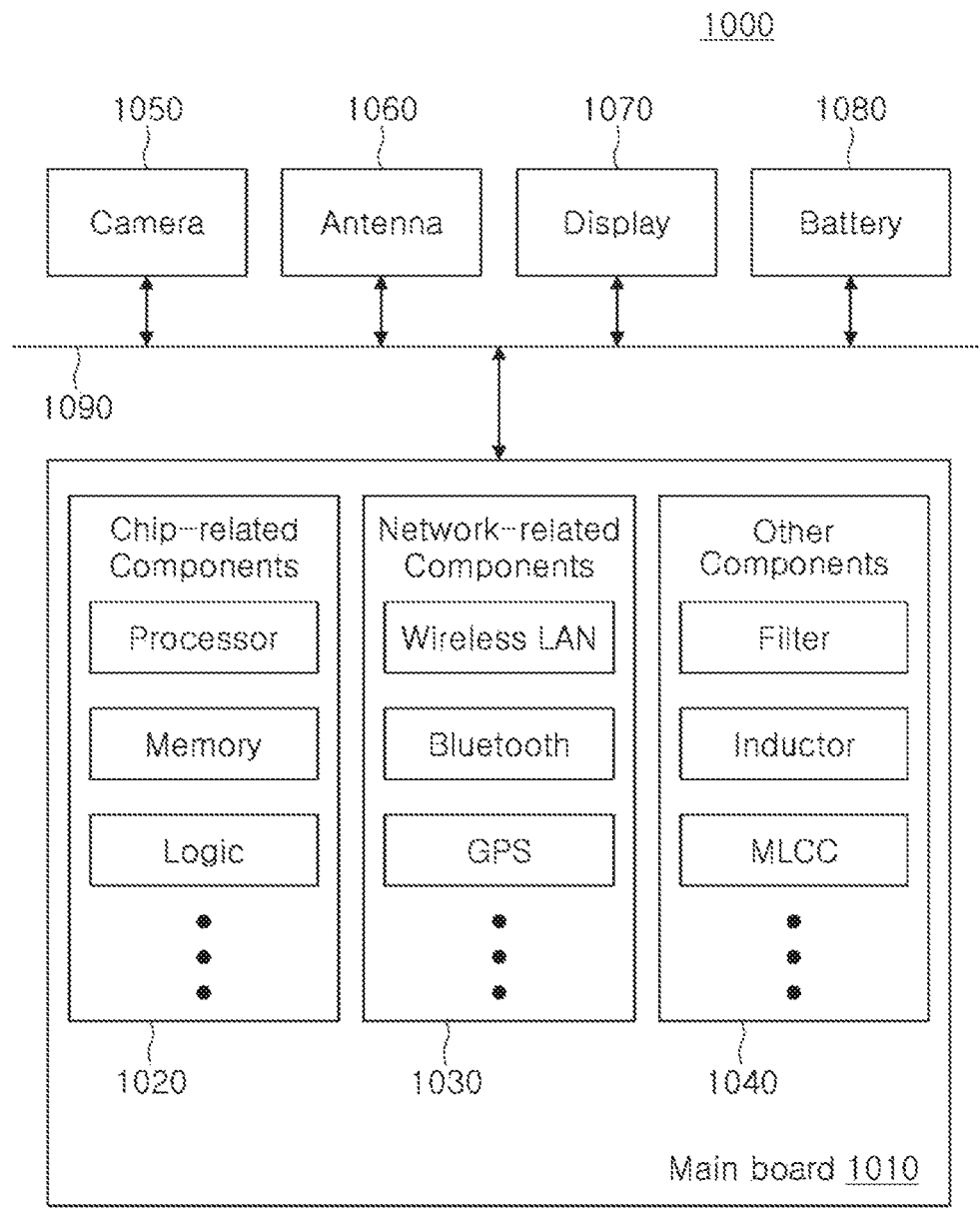
FIG. 1 is a schematic block diagram illustrating an example of an electronic device system.

Hereinafter, embodiments of the present disclosure will be described with reference to the accompanying drawings. In the drawings, shapes, sizes, and the like, of elements may be exaggerated or briefly illustrated for clarity of description.

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (CPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device processing data.

Figure 2:
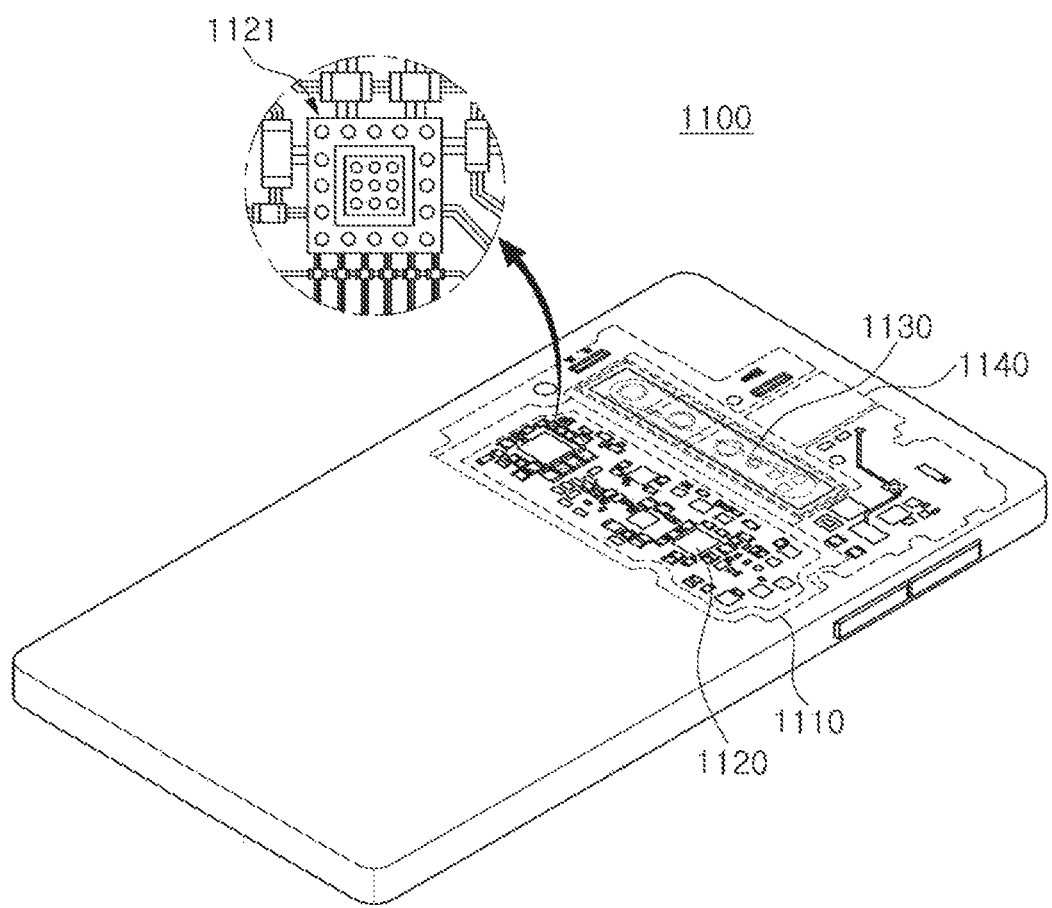
FIG. 2 is a schematic perspective view illustrating an example of an electronic device.

FIG. 2 is a schematic perspective diagram illustrating an example of an electronic device.

Referring to FIG. 2, an electronic device may be, for example, a smartphone 1100. A mainboard 1110 may be accommodated in the smartphone 1100, and various electronic components 1120 may be physically and/or electrically connected to the mainboard 1110. In addition, other components that may or may not be physically or electrically connected to the printed circuit board 1110, such as a camera module 1130 and/or a speaker 1140, may be accommodated in the mainboard 1110. A portion of the electronic components 1120 may be chip related components, for example, a semiconductor package 1121, but are not limited thereto. The semiconductor package 1121 may be a surface mounted type, such as a semiconductor chip or a passive component on a package board of a multilayer printed circuit board, but is not limited thereto. Meanwhile, the electronic device is not necessarily limited to the smartphone 1100, but may be other electronic devices as described above.

Figure 3:
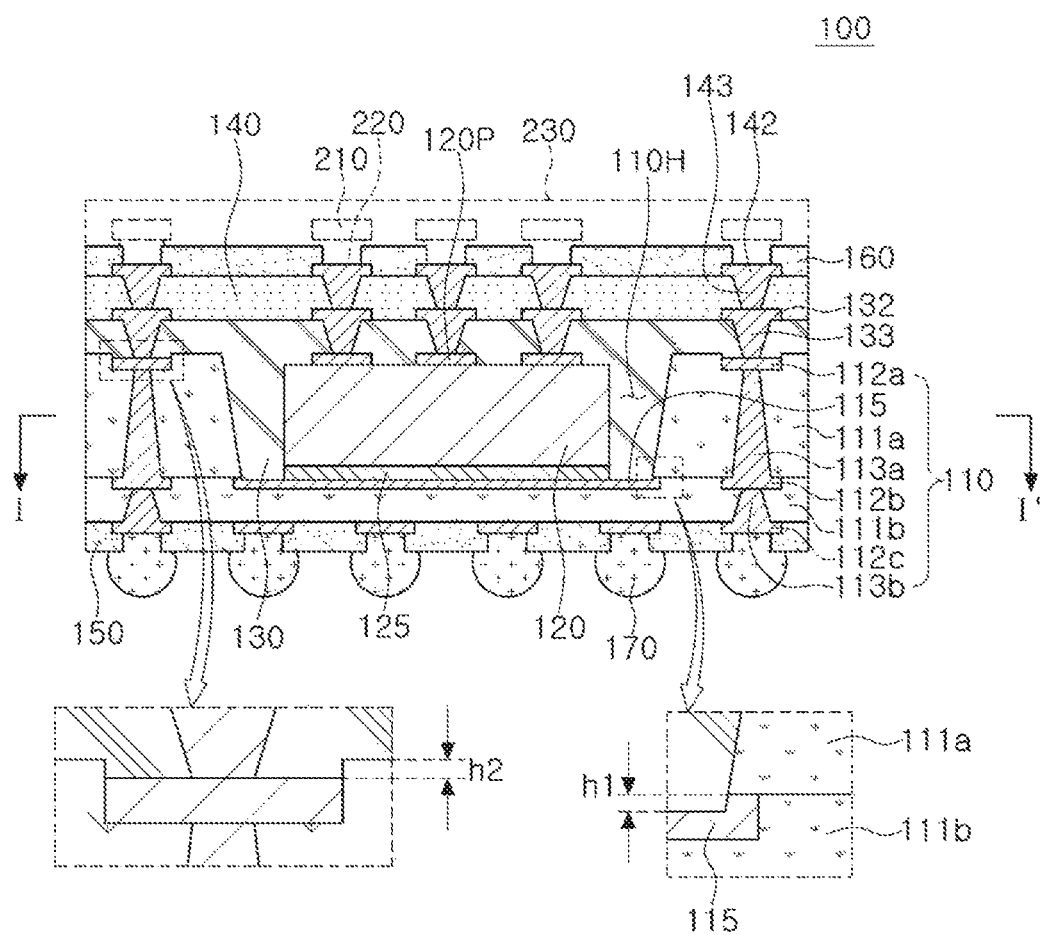
FIG. 3 is a schematic cross-sectional view illustrating an example of a substrate with an electronic device embedded therein.

FIG. 3 is a schematic cross-sectional view illustrating an example of a substrate with an electronic device embedded therein.

Figure 4:
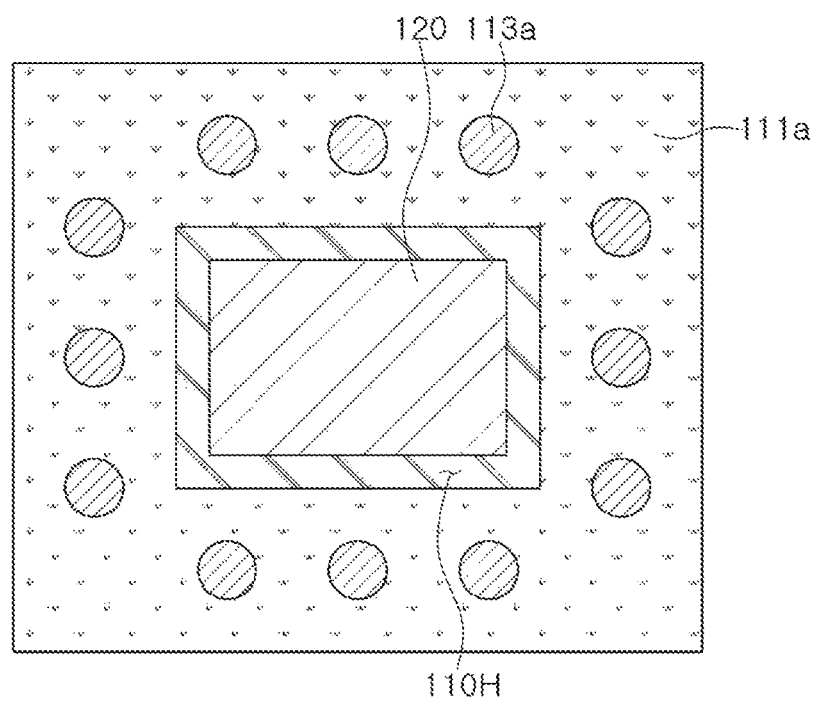
FIG. 4 is a schematic cross-sectional view taken along line I-I' of the substrate with an electronic device embedded therein of FIG. 3.

FIG. 4 is a schematic cross-sectional view taken along line I-I' of the substrate with an electronic device embedded therein of FIG. 3.

Referring to FIGS. 3 and 4, a substrate with an electronic component embedded therein 100 according to an example may include a core substrate 110, an electronic component 120, insulating materials 130 and 140, wiring layers 132 and 142, connection via layers 133 and 143, passivation layers 150 and 160, and an electrical connection metal bump 170. The core substrate 110 may include a first insulating layer 111$a$, a first wiring layer 112$a$ embedded in the first insulating layer 111$a$ such that an upper surface thereof is exposed from an upper surface of the first insulating layer 111$a$, a second wiring layer 112$b$ disposed to protrude on a lower surface of the first insulating layer 111$a$, a first connection via layer 113$a$ penetrating the first insulating layer 111$a$ and connecting the first and second wiring layers 112$a$ and 112$b$, a second insulating layer 111$b$ disposed on the lower surface of the first insulating layer 111$a$ and burying the second wiring layer 112$b$, a third wiring layer 112$c$ disposed to protrude on a lower surface of the second insulating layer 111$b$, and a second connection via layer 113$b$ penetrating the second insulating layer 111$b$ and connecting the second and third wiring layers 112$b$ and 112$c$. The core substrate 110 may have a cavity 110H that penetrates the first insulating layer 111$a$ but does not penetrate the second insulating layer 111$b$. The cavity 110H may have a stopper layer 115 as a bottom surface thereof. The first and second insulating layers 111$a$ and 111$b$ may be provided as insulating bodies of the core substrate 110.

The electronic component 120 may be disposed on the stopper layer 115 in the cavity 110H. The first insulating material 130 may cover at least a portion of each of the core substrate 110 and the electronic component 120. A fourth wiring layer 132 may be disposed on the first insulating material 130. The second insulating material 140 may be disposed on the first insulating material 130 to bury the fourth wiring layer 132. A fifth wiring layer 142 may be disposed on the second insulating material 140. The first passivation layer 150 may be disposed on the lower surface of the second insulating layer 111$b$, and have a plurality of first openings exposing a portion of the third wiring layer 112$c$. The second passivation layer 160 may be disposed on an upper surface of the second insulating material 140, and may have a plurality of second openings exposing a portion of the fifth wiring layer 142. The electrical connection metal bump 170 may be disposed on the first openings of the first passivation layer 150, respectively, and may be connected to the respectively exposed third wiring layers 112$c$.

As described above, with the arrival of the 5G era, the number of components that should be mounted on a mainboard of a smartphone is increasing. In addition, while maintaining compatibility with existing 4G LTE communications, it is necessary to secure a space for mounting additional components such as an antenna and a baseband modem for 5G communication to the mainboard. Therefore, in addition to miniaturization of each component, miniaturization is being considered by modularizing existing components in the form of SiP. As a structure for SiP modularization, for example, it may be considered to manufacture a single module by mounting a passive element on a substrate having an IC embedded therein. In this case, as a structure in which IC is embedded in the substrate, for example, a structure in which a four-layer core substrate is manufactured, a non-penetrating cavity is formed in a portion of layers of the four-layer core substrate, an insulation layer and a circuit layer are formed only after the IC is embedded may be considered.

However, when the substrate with the electronic component embedded therein is manufactured through the core substrate having such a non-penetrating cavity, the insulating layer may only be formed on one side of the core substrate, and a stress, may be continuously accumulated only to the upper portion of the substrate due to curing shrinkage of a raw material itself. In this case, the carrier acting as a reinforcing material may be attached to a lower portion of the core substrate to suppress warpage generated during the process to some extent, but when the carrier is desorbed in a manufacturing process completion process, stress may occur, resulting in smile warpage.

On the other hand, the substrate with the electronic component embedded therein 100 according to an example may use a cureless substrate having a vertically inverted form as the core substrate 110. For example, the core substrate 110 may have a multilayer substrate form in which a second insulating layer 111b is formed on the first insulating layer 111a for build-up, and in this case, the core substrate 110 may be disposed such that the first wiring layer 112a having an embedded pattern faces upward. In this case, warpage may occur in an opposite direction in which the first wiring layer 112a is embedded. When the core substrate 110 is used for embedding the electronic component 120, even if the insulating layer is only formed, on one side after the electronic component 120 is embedded, the stress may be offset as a result, and warpage may be reduced in terms of a finished product. Stress offset will be described with respect to a manufacturing prose described later.

Hereinafter, each configuration included in the substrate with the electronic component embedded therein 100 according to an example will be described in more detail with reference to the accompanying drawings.

The core substrate 110 may further improve rigidity of the substrate with the electronic component embedded therein 100 according to a specific material, and may serve to secure thickness uniformity of the first insulating material 130. In addition, since the core substrate 110 includes first to third wiring layers 112a, 112b, and 112c and first and second connection via layers 113a and 113b, various circuit designs are possible, and an upper and lower electrical connection path may also be provided. In addition, the core substrate 110 may include a third wiring layer 112c disposed on a lower level than an inactive surface of the electronic component 120, thereby easily providing backside wiring layer. The core substrate 110 may be formed in a multilayered structure, other than in as shown in the drawings. For example, the core layer 110 may be further disposed according to the required number of layers of an insulation layer, a wiring layer, and a connection via layer below the second insulation layer 111b.

The core substrate 110 may have a cavity 110H in which a stopper layer 115 is disposed on a bottom surface thereof. The cavity 110H may be formed to penetrate the first insulating layer 111a from the upper surface of the first insulating layer 111a toward the lower surface thereof. A depth of the cavity 110H may vary depending on a position of the stopper layer 115. For example, in an example, the cavity 110H may not penetrate the second insulating layer 111b. The cavity 110H may have a tapered profile in which a width of a cross-section thereof becomes narrower from an upper side to a lower side thereof, but is not limited thereto.

An insulating material may be used as a material of the first insulating layers 111a and 111b, respectively. In this case, an insulating material of resin coated copper (RCC) may be used as the insulating material. However, the present disclosure is not limited thereto, and apart therefrom, a thermosetting resin such as an epoxy resin, a thermoplastic resin such as a polyimide resin, an insulating material in which the thermosetting resin or the thermoplastic resin is impregnated in a core material with an inorganic filler and/or a glass fiber (or a glass cloth or a glass fabric), such as prepreg, Ajinomoto build-up film (ABF), FR-4, bismaleimide triazine (BT), or the like, for example, may be used. When a material having high rigidity, such as prepreg including glass fiber, warpage may be effectively controlled. The first insulating layer 111a may be thicker than the second insulating layer 111b. The first and second insulating layers 111a and 111b may include the same material, or may include different materials. A boundary of the first and second insulating layers 111a and 111b may be clear, or the first and second insulating layers 111a and 111b may be integrated to make it difficult to separate the boundary by itself.

The first to third wiring layers 112a, 112b, and 112c may include a metal material such as copper (Cu), aluminum (Al), silver (Ag), tin (Sn), gold (Au), nickel (Ni), lead (Pb), titanium (Ti), or alloys thereof. The first to third wiring layers 112a, 112b, and 112c may perform various functions depending on designs, respectively. For example, the first to third wiring layers 112a, 112b, and 112c may include a ground (GND) pattern, a power (PWR) pattern, a signal (S) pattern, and the like. Here, the signal (S) pattern may include various signals other than a ground (GND) pattern, a power (PWR) pattern, and the like, such as a data signal, and the like. These patterns may have a linear shape, a planar shape, or a pad shape. The first to third wiring layers 112a, 112b, and 112c may be formed through a plating process such as an additive process (AP), a semi-AP (SAP) process, a modified SAP (MSAP) process, a tenting (TT) process, or the like, and accordingly, the first to third wiring layers 112a, 112b, and 112c may include a seed layer, an electroless plating layer, and an electrolytic plating layer formed based on the seed layer, respectively. An upper surface of the first wiring layer 112a may have a step h2 with respect to an upper surface of the first insulating layer 111a. For example, the upper surface of the first wiring layer 112a may be located at a lower level than the upper surface of the first insulating layer 111a.

The first and second connection via layers 113a and 113b may penetrate the first and second insulating layers 111a and 111b, respectively, and connect the first to third wiring layers 112a, 112b, and 112c. The first and second connection via layers 113a and 113b may also include a metal material such as copper (Cu), aluminum (Al), silver (Ag), tin (Sn), gold (Au), nickel (Ni), lead (Pb), titanium (Ti), or alloys thereof. The first and second connection via layers 113a and 113b may include a signal connection via, a ground connection via, a power connection via, and the like depending on designs, respectively. The connection vias of the first and second connection via layers 113a and 113b may be completely filled with a metal material, respectively, or the metal material may be formed along a wall surface of a via hole.

In the first connection via layer 113a, since a portion of the first wiring layer 112a serves as a stopper for forming a via hole, the connection vias of each of the first connection via layers 113a may have a tapered profile that has a wider width of a cross-section thereof from an upper surface to a lower surface thereof. In the second connection via layer 113b, since a portion of the second wiring layer 112b serves as a stopper for forming a via hole, the connection vias of each of the second connection via layers 113b may have a tapered profile that has a wider width of a cross-section thereof from an upper surface to a lower surface thereof. The first and second connection via layers 113a and 113b may also be formed by a plating process, for example, a process such as an AP, a SAP, a MSAP, a TT, or the like, and accordingly, The first and second connection via layers 113a and 113b may include a seed layer, an electroless plating layer, and an electrolytic plating layer formed based on the seed layer. The first connection via layer 113a may be simultaneously formed by the same plating process as that of the second wiring layer 112b, and may be integrated with the second wiring layer 112b without boundaries. The second connection via layer 113b may be simultaneously formed by the same plating process as that of the third wiring layer 112c, and may be integrated with the third wiring layer 112c without boundaries.

The stopper layer 115 may be disposed on a lower surface of the first insulating layer 111a, and may be covered with the second insulating layer 111b. The stopper layer 115 may be formed by plating process, for example, process such as an AP, a SAP, a MSAP, a TT, or the like, and accordingly, the stopper layer 115 may include a seed layer, an electroless plating layer, and an electrolytic plating layer formed based on the seed layer. The stopper layer 115 may be simultaneously formed by the same plating process as that of the second wiring layer 112b, and thus may be disposed on the same level as the second wiring layer 112b, and may include the same metal material as the second wiring layer 112b, for example, copper (Cu) or aluminum (Al), silver (Ag), tin (Sn), gold (Au), nickel (Ni), lead (Pb), titanium (Ti), alloys thereof, or the like. The stopper layer 115 may have a central region exposed from the first insulating layer 111a by the cavity 110H, and an edge region surrounding the central region and covered with the first insulating layer 111a. The central region may be partially removed in a process of forming the cavity 110H, and thus the central region may be thinner than the edge region. That is, both thereof may have a step h1.

The electronic component 120 may be disposed in a recess 110H. A rear surface of the electronic component 120 may be attached to the stopper layer 115 through a known adhesive, such as a die attach film (DAF). The electronic component 120 may be configured as an IC in which several hundreds to several millions or more of devices are integrated in a single chip. For example, the electronic component 120 may be implemented by a processor chip such as a central processing unit (CPU), a graphics processor (GPU), a field programmable gate array (FPGA), a digital signal processor, a cryptographic processor, a microprocessor, microcontroller, and the like, specifically, an application processor (AP), but an embodiment thereof is not limited thereto. The electronic component 120 may also be implemented by a memory such as a volatile memory (e.g., a DRAM), a non-volatile memory (e.g., a ROM), a flash memory), or the like, or a logic such as an application-specific IC (ASIC), or the like. Meanwhile, the electronic component 120 may also be configured as a chip-type passive component.

The electronic component 120 may be formed based on an active wafer. As a base material of a body of the electronic component 120, silicon (Si), germanium (Ge), gallium arsenide (GaAs), or the like, may be used. Various circuits may be formed in the body. A connection pad 120P may be disposed on an active surface of the body. The connection pad 120P may be configured to electrically connect the electronic component 120 to the other components, and as a material of forming the connection pad 120P of the electronic component 120, a conductive material such as copper (Cu), aluminum (Al), or the like, may be used without particular limitation. A passivation film for covering at least a portion of the connection pad 120P and exposing at least a portion of the connection pad 120P may be disposed on the active surface of the body. The passivation film may be configured as an oxide film or a nitride film, or may be configured as a dual layer including an oxide film and a nitride film. An insulating film, and the like, may further be disposed in a desired position. The electronic component 120 may be configured as a bare die, but an embodiment thereof is not limited thereto. The electronic component 120 may also be configured as a packaged die.

The first and second insulating materials 130 and 140 may be sequentially laminated on the core substrate 110 and the electronic component 120. The first insulating material 130 may cover at least a portion each of the core substrate 110 and the electronic component 120. In addition, the first insulating material 130 may fill at least a portion of the cavity 110H. A material of the first and second insulating materials 130 and 140 is not particularly limited. For example, an insulating material may be used, and in this case, as the insulating material, a thermosetting resin such as an epoxy resin, a thermoplastic resin such as a polyimide resin, an insulating material in which the thermosetting resin or the thermoplastic resin is mixed with an inorganic filler or is impregnated in a core material with an inorganic filler and/or a glass fiber (or a glass cloth or a glass fabric), such as prepreg, Ajinomoto build-up film (ABF), FR-4, bismaleimide triazine (BT), or the like, may be used, for example. If desired, a photoimageable encapsulant (PIE) resin may be used as the first and second insulating materials 130 and 140. The first and second insulating materials 130 and 140 may include the same materials as each other, or may include different materials. A boundary of the first and second insulating materials 130 and 140 may be clear, or the first and second insulating materials 130 and 140 may be integrated to make it difficult to separate the boundary by itself. If necessary, an insulating material may be further formed on the second insulating material 140, and in this case, a wiring layer and a connection via layer to be described later may be further formed according to the number of insulating materials, which are additionally formed. If necessary, the second insulating material 140 may be omitted, and in this case, the fifth wiring layer 142 and the fourth connection via layer 143 to be described later may also be omitted.

The fourth and fifth wiring layers 132 and 142 may include a metal material such as copper (Cu), aluminum (Al), silver (Ag), tin (Sn), gold (Au), nickel (Ni), lead (Pb), titanium (Ti), or alloys thereof. The fourth and fifth wiring layers 132 and 142 may perform various functions according to designs. For example, the fourth and fifth wiring layers 132 and 142 may include a ground (GND) pattern, a power (PWR) pattern, a signal (S) pattern, and the like. Here, the signal (S) pattern may include various signals other than a ground (GND) pattern, a power (PWR) pattern, and the like, for example, a data signal, and the like. These patterns may have a line shape, a plane shape, or a pad shape. The fourth and fifth wiring layers 132 and 142 may also be formed through a plating process such as a process of an AP, a SAP, a MSAP, a TT, or the like, and accordingly, the fourth and fifth wiring layers 132 and 142 may include a seed layer, an electroless plating layer, and an electrolytic plating layer formed based on the seed layer.

The third and fourth connection via layers 133 and 143 may penetrate the first and second insulating materials, respectively. The third connection via layer 133 may connect the fourth wiring layer 132 to the connection pad 120P of the electronic component 120. In addition, the third connection via layer 133 may connect the first and fourth wiring layer 112a and 132. The fourth connection via layer 143 may connect the fourth and fifth wiring layers 132 and 142. The third and connection via layers 133 and 143 may also include a metal material such as copper (Cu), aluminum (Al), silver (Ag), tin (Sn), gold (Au), nickel (Ni), lead (Pb), titanium (Ti), alloys thereof, or the like. The third and fourth connection via layers 133 and 143 may also include signal connection vias, ground connection vias, power connection vias, and the like, depending on the design. The third and fourth connection via layers 133 and 143 may be completely filled with a metal material, the metal material may be formed along a wall surface of a via hole. In the third connection via layer 133, since a portion of the connection pad 120P and/or the first wiring layer 112a may serve as a stopper for forming a via hole, the connection vias of each of the third connection via layers 133 may have a tapered profile that have a narrower width of a cross-section thereof from an upper surface to a lower surface thereof as opposed to the first and second connection via layers 113a and 113b. In the fourth connection via layer 143, since a portion of the fourth wiring layer 132 may serve as a stopper for forming a via hole, the connection vias of each of the fourth connection via layers 143 may have a tapered profile that has a cross-section having a width narrowed in a direction from an upper surface to a lower surface thereof as opposed to the first and second connection via layers 113a and 113b. The third and fourth connection via layers 133 and 143 may also be formed by a plating process, for example, a process of an AP, a SAP, a MSAP, a TT, or the like, and accordingly, the third and fourth connection via layers 133 and 143 may include a seed layer, an electroless plating layer, and an electroplating layer formed based on the seed layer. The third connection via layer 133 may be simultaneously formed by the same plating process as that of the fourth wiring layer 132, and may be integrated without boundaries. The fourth connection via layer 143 may be simultaneously formed by the same plating process as that of the fifth wiring layer 142, and may be integrated without boundaries.

The first passivation layer 150 may be an additional configuration, and may protect the third wiring layer 112c from external physical and chemical damages. The first passivation layer 150 may be disposed on a lower surface of the second insulating layer 111b and may cover at least portion of the third wiring layer 112c, and may have a plurality of first openings for exposing a portion of the third wiring layer 112c, respectively. A material of the first passivation layer 150 may not be limited to any particular material. For example, an insulating material may be used, and as an insulating material, a thermosetting resin such as an epoxy resin, a thermoplastic resin such as a polyimide resin, an insulating material in which the thermosetting resin or the thermoplastic resin is mixed with an inorganic filler or is impregnated in a core material with inorganic filler with a glass fiber, such as prepreg, ajinomoto build-up film (ABF), FR-4, bismaleimide triazine (BT), or the like, may be used. Alternatively, a solder resist (SR) may be used.

The second passivation layer 160 may be an additional configuration, and may protect the fifth wiring layer 142 from external physical and chemical damages. The second passivation layer 160 may be disposed on an upper surface of the second insulating material 140 and may cover at least a portion of the fifth wiring layer 142, and may have a plurality of second openings for exposing a portion of the fifth wiring layer 142, respectively. A material of the second passivation layer 160 may not be limited to any particular material. For example, an insulating material may be used, and as an insulating material, a thermosetting resin such as an epoxy resin, a thermoplastic resin such as a polyimide resin, an insulating material in which the thermosetting resin or the thermoplastic resin is mixed with an inorganic filler or is impregnated in a core material with inorganic filler with a glass fiber, such as prepreg, ajinomoto build-up film (ABF), FR-4, bismaleimide triazine (BT), or the like, may be used. Alternatively, a solder resist (SR) may be used.

The electrical connection metal bump 170 may be disposed on the first openings of the first passivation layer 150, respectively. The electrical connection metal bump 170 may be connected to the exposed third wiring layers 112c, respectively. The electrical connection metal bump 170 may physically and/or electrically connect the substrate with the electronic component embedded therein 100 to an external entity. For example, the substrate with the electronic component embedded therein 100 may be mounted on a mainboard of an electronic device, a ball grid array (BGA) substrate, or the like, through the electrical connection metal bump 170. The electrical connection metal bump 170 may be formed of tin (Sn), or an alloy including tin (Sn), such as a solder, but this is merely an example, an embodiment thereof is not limited thereto. The electrical connection metal bump 170 may be configured as a land, a ball, a pin, or the like. The electrical connection metal bump 170 may include multiple layers, or a single layer. When the electrical connection metal bump 170 includes multiple layers, the electrical connection metal bump 170 may include copper pillar or solder, and when the electrical connection metal bump 170 includes a single layer, the electrical connection metal bump 170 may include tin-silver solder or copper. However, this is also merely an example, an embodiment thereof is not limited thereto. The number of the electrical connection metal bumps 170, a gap between the electrical connection metal bumps 170, and a dispositional form of the electrical connection metal bumps 170 may not be limited to any particular examples, and may be varied in embodiments.

A component 210 may be further disposed on the second passivation layer 160. The component 210 may be disposed on the second passivation layer 160 in a surface mounting form through a connection member 220, respectively. The component 210 may be an active component and/or a passive component. Examples of the active components may be the above-described IC described with respect to the electronic component 120. Examples of the passive components may be chip-type capacitors such as multilayer ceramic capacitors (MLCCs) and chip-type inductors such as power inductors (PIs). The connection member 220 may include tin (Sn) or an alloy including tin (Sn), for example, solder or the like, respectively. If necessary, a molding material 230 covering the component 21 may be further disposed on the second passivation layer 160, and the molding material 230 may be a known epoxy molding compound (EMC), but is not limited thereto. When the component 210 is further disposed, the substrate with the electronic component embedded therein 100 may be utilized as SiP.

Meanwhile, the substrate with the electronic component embedded therein 100 may have a plurality of cavities 110H, and in this case, the above-described stopper layer 115 may be applied to each cavity 110H. The same or different electronic components may be disposed in each cavity 110H.

FIGS. 5 to 8 are schematic process diagrams illustrating an example of manufacturing the substrate with the electronic component embedded therein in FIG. 3.

Figure 5:
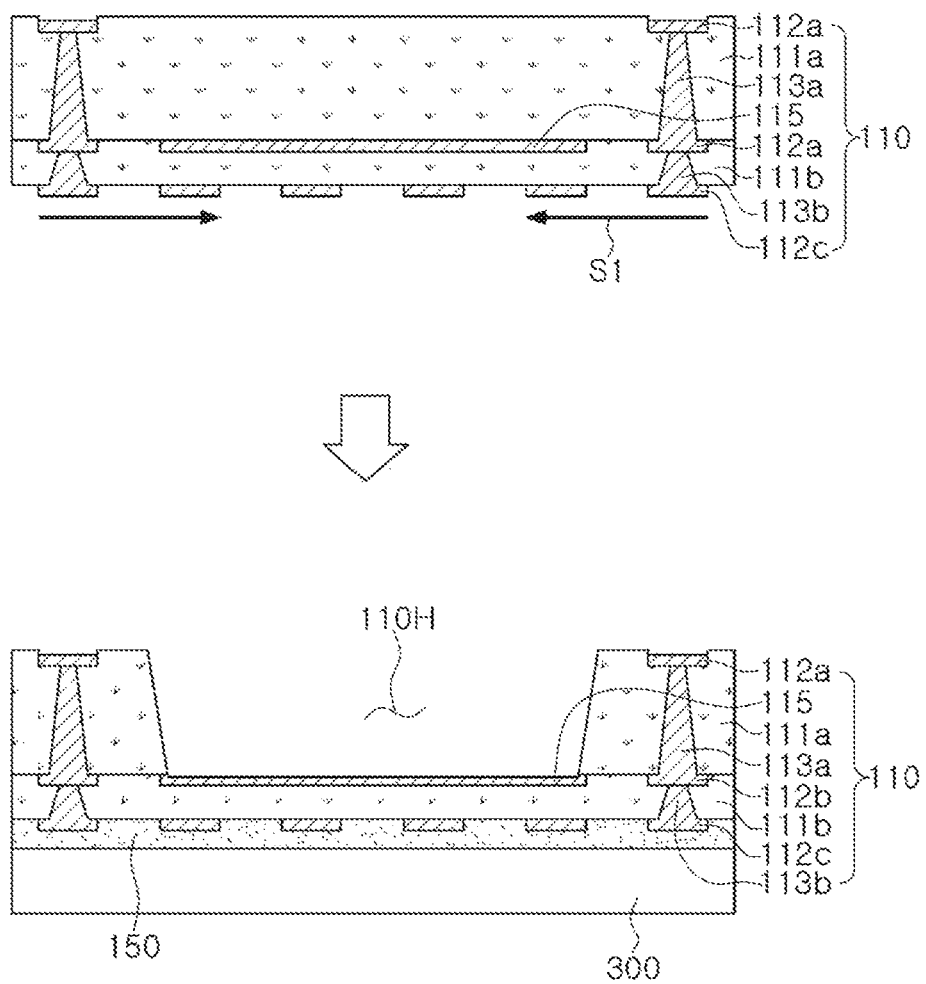
FIGS. 5 to 8 are schematic process views illustrating an example of manufacturing the substrate with an electronic device embedded therein of FIG. 3.

Referring to FIG. 5, first, a core substrate 110 is prepared. The core substrate 110 may be manufactured through a coreless process. For example, a first wiring layer 112a may be formed on a detach carrier in a plating process, first insulating layer 111a may be laminated using RCC, and the like, and then a stopper layer 115 and a second wiring layer 112b and a first connection via layer 113a may be formed after a via hole is processed, a second insulating layer 111b may be laminated on the first insulating layer 111a using RCC, and the like, and then a third wiring layer 112c and a second connection via layer 113b may be formed after a via hole is processed in a plating process. In this case, when the second insulating layer 111b is formed, stress S1 may occur due to curing shrinkage of the second insulating layer 111b. In an example, the core substrate 110 manufactured so that the stress S1 is offset by stresses S2 to S4 to be described later may be used by being separated from the detach carrier and then by being vertically inverted. Next, the core substrate 110 may be attached on the carrier 300 for warpage control. In this case, a first passivation layer 150 formed of ABF, or the like may be disposed between the core substrate 110 and the carrier 300. Thereafter, recess 110H may be formed by a process such as sandblasting, or the like.

Figure 6:
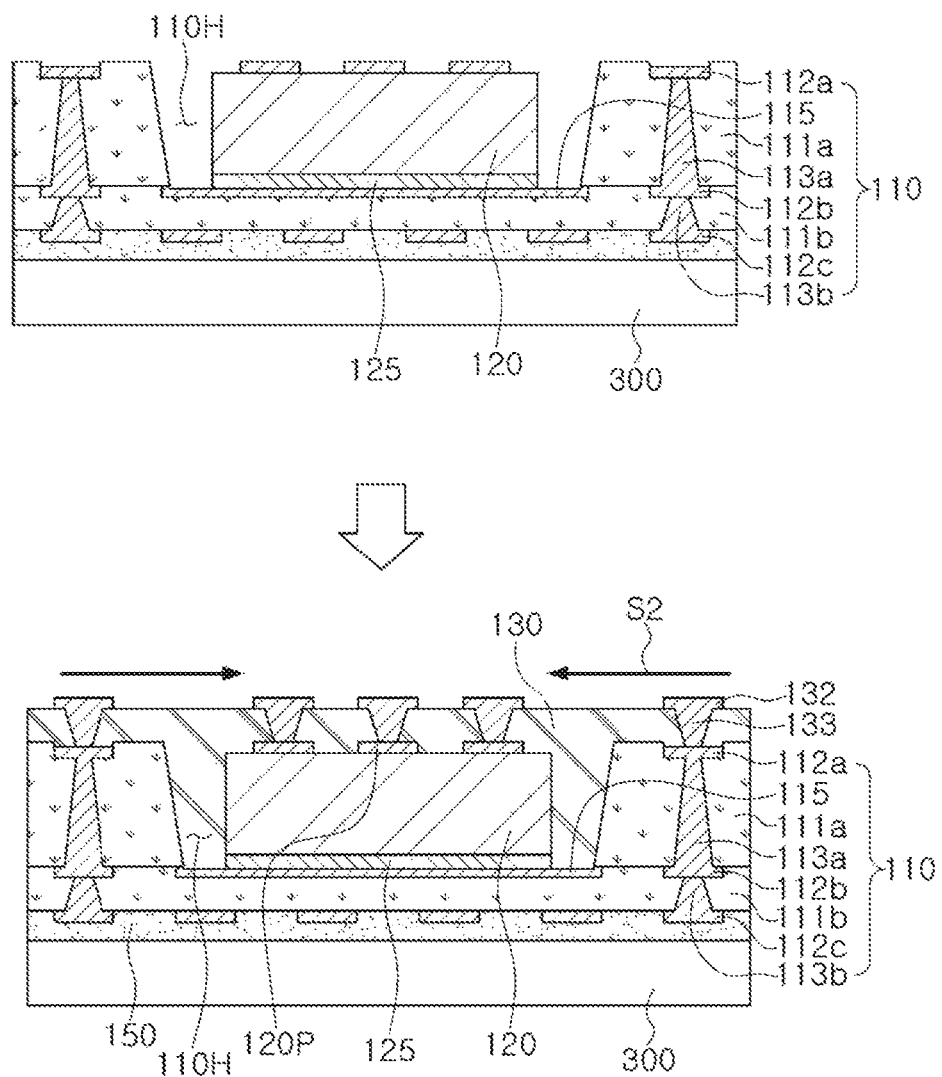

Referring to FIG. 6, next, the electronic component 120 may be disposed in the recess 110H. The electronic component 120 may be disposed in a face-up form. For example, a rear surface of the electronic component 120 may be attached to the stopper layer 115 with an adhesive 125 such as DAF, or the like. Next, after laminating the first insulating material 130 on the core substrate 110 and the electronic component 120 using prepreg, ABF, or the like, a fourth wiring layer 132 and a third connection via layer 133 may be formed by a plating process after a via hole is processed. In this case, stress S2 due to curing shrinkage of the first insulating material 130 may occur in an upper portion thereof, but warpage may be suppressed by the carrier 300.

Figure 7:
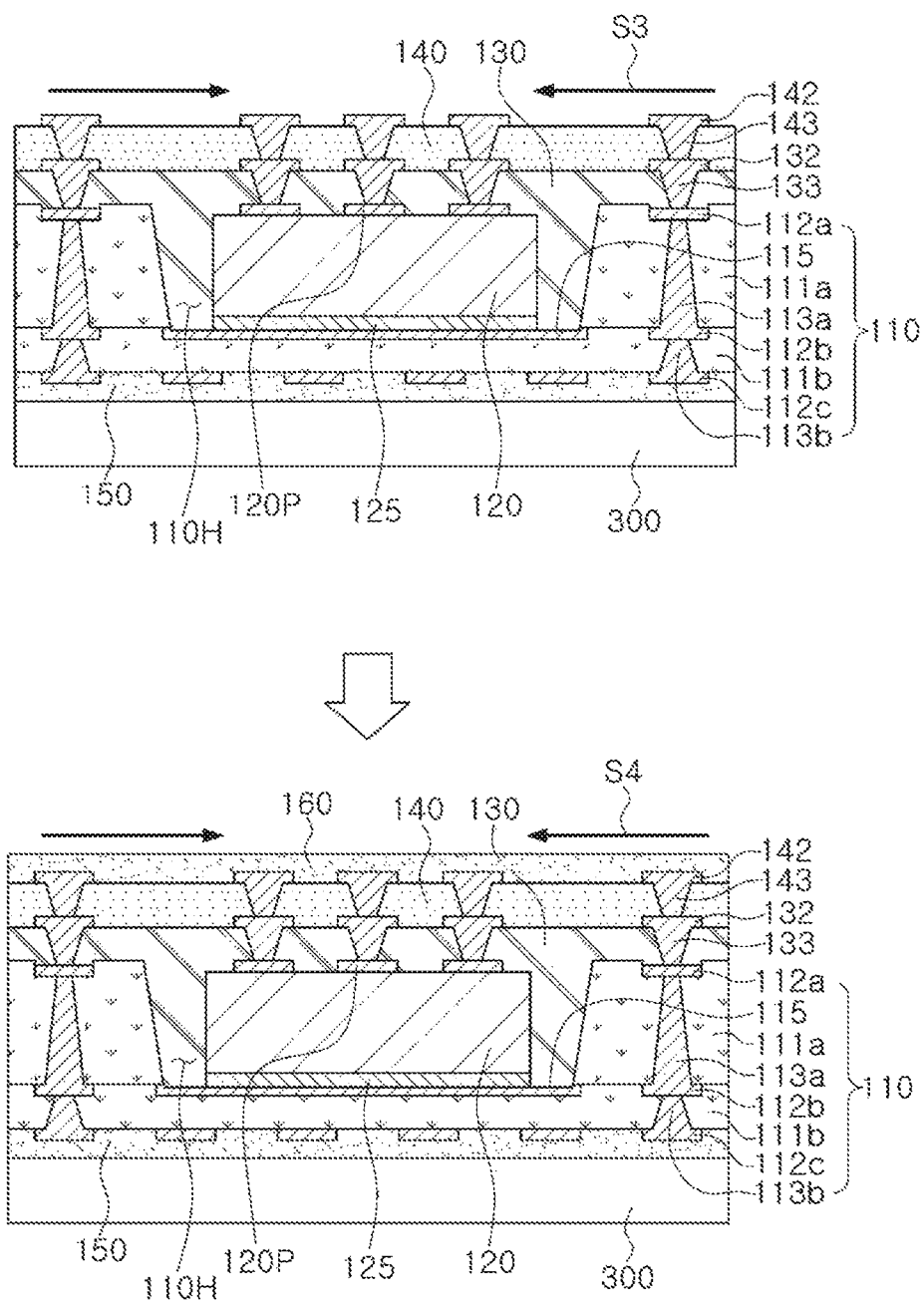

Referring to FIG. 7, next, a second insulating material 140 may be formed on the first insulating material 130 by lamination of prepreg or ABF, and a fifth wiring layer 142 and a fourth connection via layer 143 may be formed by a plating process after a via hole is processed. In this case, stress S3 due to curing shrinkage of the second insulating material 140 may occur in an upper portion thereof. Warpage caused by the stress S3 may also be suppressed by the carrier 300. Next, the second passivation layer 160 may be formed on the insulating material 140 by a method such as lamination of ABF, or the like. In this case, a stress S4 due to curing shrinkage of the second insulating material 160 may occur in an upper portion thereof. The warpage caused by the stress S4 can also be suppressed by the carrier 300.

Figure 8:
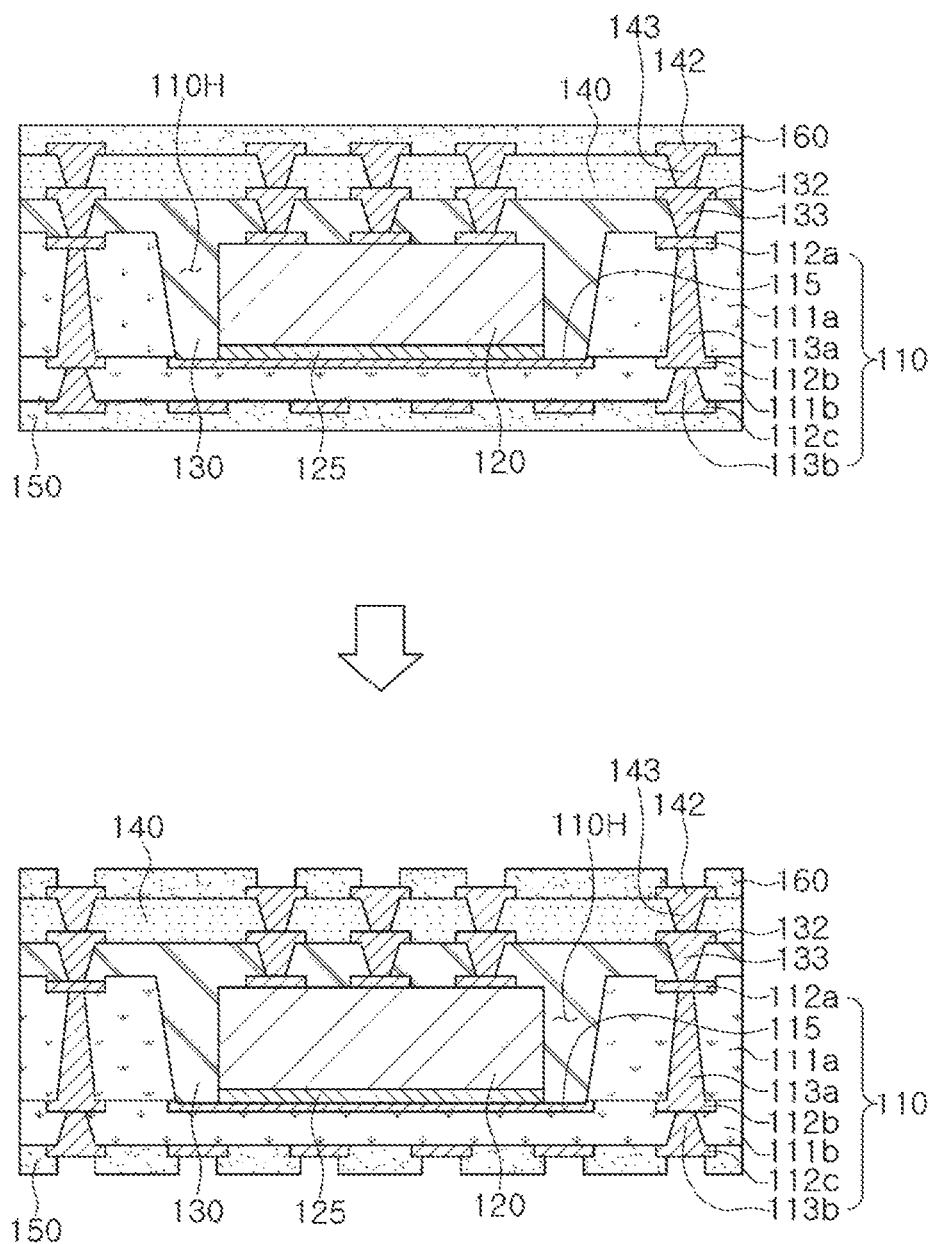

Referring to FIG. 8, next, the carrier 300 is separated. In this case, warpage may occur due to the stored stresses S1 to S4, but in an example, the lower stress S1 and the upper stresses S2 to S4 may be offset to some extent, thereby reducing the generated warpage. Next, first and second openings may be formed in the first and second passivation layers 150 and 160, respectively. If necessary, the electrical connection metal bump 170 may be further formed. If necessary, the component 210 may be further mounted through the connection member 220 and covered with the molding material 230. The substrate with the electronic component embedded therein 100 according to the example described above may be manufactured through a series of processes.

In the example embodiments, the terms "side region," "side surface," and the like, may be used to refer to a surface formed taken in right/left directions, the terms "lower side," "lower portion," "lower surface," and the like, may be used to refer to directions facing downwardly with reference to a cross-section in the diagrams for ease of description, and the terms "upper side," "upper portion," "upper surfaces," and the like, may be used to refer to directions opposing the above directions. The notion that an element is disposed on a side region, an upper side, an upper region, or a lower resin may include the configuration in which the element is directly in contact with an element configured as a reference in respective directions, and the configuration in which the element is not directly in contact with the reference element. The terms may be defined as above for ease of description, and the scope of right of the example embodiments is not particularly limited to the above terms.

In the example embodiments, the term "connected" may not only refer to "directly connected" but also include "indirectly connected" by means of an adhesive layer, or the like. Also, the term "electrically connected" may include both of the case in which elements are "physically connected" and the case in which elements are "not physically connected." Further, the terms "first," "second," and the like may be used to distinguish one element from the other, and may not limit a sequence and/or an importance, or others, in relation to the elements. In some cases, a first element may be referred to as a second element, and similarly, a second element may be referred to as a first element without departing from the scope of right of the example embodiments.

In the example embodiments, the term "example embodiment" may not refer to one same example embodiment, but may be provided to describe and emphasize different unique features of each example embodiment. The above suggested example embodiments may be implemented do not exclude the possibilities of combination with features of other example embodiments. For example, even though the features described in one example embodiment are not described, in the other example embodiment, the description may be understood as relevant to the other example embodiment unless otherwise indicated.

The terms used in the example embodiments are used to simply describe an example embodiment, and are not intended to limit the present disclosure. A singular term includes a plural form unless otherwise indicated.

As set forth above, according to the present disclosure, a substrate with an electronic component embedded therein capable of reducing warpage even in an asymmetrical structure may be provided.

According to the present disclosure, a substrate with an electronic component embedded therein capable of modularization and miniaturization in a SiP form may be provided.

While the example embodiments have been shown and described above, it will be apparent to those skilled in the art that modifications and variations could be made without departing from the scope of the present invention as defined by the appended claims.

What is claimed is:

1. A substrate with an electronic component embedded therein, comprising:
a core substrate including an insulating body having a first surface and a second surface, opposite to the first surface, a first wiring layer embedded in the insulating body such that one surface thereof is exposed from the first surface, and a second wiring layer disposed on the insulating body to protrude on the second surface, the core substrate having a cavity penetrating a portion of the insulating body from the first surface toward the second surface and having a stopper layer as a bottom surface thereof;
an electronic component disposed on the stopper layer in the cavity;
a first insulating material covering at least a portion of each of the core substrate and the electronic component; and
a third wiring layer disposed on the first insulating material,
wherein the first, second, and third wiring layers are connected to one another by a plurality of connection via layers,
a connection via of an upper layer of the plurality of connection via layers, which connects the first wiring layer to the third wiring layer, has an outer wall tapered in one direction, and
a connection via of a lower layer of the plurality of connection via layers, which is positioned at a lower level than the upper layer, has an outer wall tapered in an opposite direction to the one direction.

2. The substrate with the electronic component embedded therein of claim 1, wherein the core substrate comprises a first insulating layer having the first surface, a fourth wiring layer disposed on the first insulating layer to protrude on a surface opposite to the first surface of the first insulating layer, and a second insulating layer disposed on the surface opposite to the first surface of the first insulating layer and having the second surface as the opposing surface facing the first insulating layer,
the insulating body comprises the first and second insulating layers,
the first wiring layer is embedded in the first insulating layer, and
the fourth wiring layer is embedded in the second insulating layer.

3. The substrate with the electronic component embedded therein of claim 2, wherein the core substrate further comprises a first connection via layer penetrating the first insulating layer and connecting the first and fourth wiring layers and a second connection via layer penetrating the second insulating layer and connecting the second and fourth wiring layers, the first connection via layer or the second connection via layer being the lower layer of the plurality of connection via layers, and
connection vias of each of the first and second connection via layers have a tapered profile in which a width of a cross-section thereof is widened in a direction from the first surface toward the second surface,
a third connection via layer, which is the upper layer of the plurality of connection via layers, penetrates the first insulating material and connects the third wiring layer to the electronic component and the first wiring layer, respectively, and
a connection via of the third connection via layer has a tapered profile in an opposite direction from the connection vias of each of the first and second connection via layers.

4. The substrate with the electronic component embedded therein of claim 2, wherein the cavity penetrates the first insulating layer but does not penetrate the second insulating layer.

5. The substrate with the electronic component embedded therein of claim 2, wherein the stopper layer and the fourth wiring layer are disposed on a same level as each other, and
the stopper layer and the fourth wiring layer comprise a same metal material as each other.

6. The substrate with the electronic component embedded therein of claim 5, wherein the stopper layer has a first region exposed from the first insulating layer by the cavity, and a second region surrounding the first region and covered with the first insulating layer, and
the first region is thinner than the second region.

7. The substrate with the electronic component embedded therein of claim 5, wherein the second wiring layer is disposed on a level lower than the stopper layer.

8. The substrate with the electronic component embedded therein of claim 1, wherein the electronic component has an active surface on which a connection pad is disposed and an inactive surface, opposite to the active surface, the inactive surface facing the stopper layer and being attached to the stopper layer through an adhesive.

9. The substrate with the electronic component embedded therein of claim 1, further comprising:
a second insulating material disposed on the first insulating material, and covering at least a portion of the third wiring layer; and
a fifth wiring layer disposed on the second insulating material.

10. The substrate with the electronic component embedded therein of claim 9, further comprising:
a first passivation layer disposed on a second surface of the insulating body, and having a first opening for exposing a portion of the second wiring layer; and
a second passivation layer disposed on the second insulating material, and having a second opening for exposing a portion of the fifth wiring layer.

11. The substrate with the electronic component embedded therein of claim 10, further comprising an electrical connection metal bump disposed on the first opening, and connected to a portion of the exposed second wiring layer.

12. The substrate with the electronic component embedded therein of claim 10, further comprising a component disposed on the second passivation layer, and connected to a portion of the exposed fifth wiring layer,
wherein the component comprises at least one of an active component or a passive component.

13. The substrate with the electronic component embedded therein of claim 1, wherein the first surface of the insulating body and the exposed one surface of the first wiring layer have a step.

14. A substrate comprising:
a first insulating layer;
a first wiring layer embedded in the first insulating layer and exposed from an upper surface of the first insulating layer;
a second insulating layer disposed on a lower surface of the first insulating layer;
a second wiring layer embedded in the second insulating layer and being in contact with the first insulating layer;

a stopper layer including a first portion in contact with the first and second insulating layers, and a second portion extending from the first portion and exposed by a cavity in the first insulating layer;

an electronic component disposed on the stopper layer in the cavity;

an insulating material covering a portion of each of the first insulating layer and the electronic component;

a first connection via disposed in the first insulating layer and connecting the first and second wiring layers to each other;

a third wiring layer disposed on an upper surface of the insulating material; and a second connection via disposed in the insulating material and connecting the first and third wiring layers to each other, wherein a width of a cross-section of the first connection via is tapered in a direction from the second insulating layer to the first insulating layer, and a width of a cross-section of the second connection via is tapered in a direction from the first insulating layer to the second insulating layer.

15. The substrate of claim 14, wherein the electronic component has an active surface on which a connection pad is disposed and an inactive surface, opposite to the active surface, the inactive surface facing the stopper layer.

16. The substrate of claim 15, further comprising:

a fourth wiring layer disposed on a lower surface of the second insulating layer;

a third connection via penetrating the second insulating layer and connecting the second and fourth wiring layers to each other; and a fourth connection via penetrating the insulating material, and connecting the third wiring layer to the connection pad of the electronic component, wherein a width of a cross-section of the third connection via is tapered in the direction from the second insulating layer to the first insulating layer, and a width of a cross-section of each of the second and fourth connection vias is tapered in a direction from the first insulating layer to the second insulating layer.

17. The substrate of claim 14, wherein the stopper layer and the second wiring layer are disposed on a same level as each other, and the stopper layer and the second wiring layer comprise a same metal material as each other.

18. The substrate of claim 14, wherein the upper surface of the first insulating layer and a surface of the first wiring layer exposed from the first insulating layer have a step.

19. The substrate of claim 14, wherein a thickness of the second insulating layer is less than a thickness of the first insulating layer.

20. The substrate of claim 14, wherein a thickness of the first portion of the stopper layer is greater than a thickness of the second portion of the stopper layer.

* * * * *